United States Patent
Braz et al.

(10) Patent No.: US 6,710,661 B2
(45) Date of Patent: Mar. 23, 2004

(54) LOW INPUT IMPEDANCE WITH AMPLIFIER

(75) Inventors: Fabio Braz, Caen (FR); Patrick Leclerc, Langrune sur Mer (FR); Lionel Guiraud, Saint Aubin sur Mer (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/161,013

(22) Filed: Jun. 3, 2002

(65) Prior Publication Data
US 2003/0006844 A1 Jan. 9, 2003

(30) Foreign Application Priority Data

Jun. 6, 2001 (FR) ............................................. 01 07389

(51) Int. Cl.$^7$ ................................................. H03F 3/45
(52) U.S. Cl. ....................................... 330/288; 330/257
(58) Field of Search ................................ 323/315, 316; 327/403; 330/257, 288

(56) References Cited

U.S. PATENT DOCUMENTS

| | | | |
|---|---|---|---|
| 3,714,600 A | * | 1/1973 | Kuijk et al. ................. 330/288 |
| 5,444,361 A | | 8/1995 | Ryat ............................ 323/312 |
| 5,498,953 A | | 3/1996 | Ryat ............................ 323/315 |
| 5,586,114 A | * | 12/1996 | Uhling et al. ......... 330/124 R X |

\* cited by examiner

*Primary Examiner*—Steven J. Mottola
(74) *Attorney, Agent, or Firm*—Aaron Waxler

(57) ABSTRACT

The present invention relates to an amplifier CD including a first and a second transistor T1 and T2, connected in series between a power supply terminal VCC and ground terminal. According to the invention the transfer terminal of the first transistor T1 is connected to the bias terminal of the second transistor T2 and forms an input of the amplifier CD, the bias terminal of the first transistor T1 being connected to a reference potential terminal. An amplifier CD in accordance with the invention has low input impedance and a low common-mode output level.

9 Claims, 3 Drawing Sheets

LOW INPUT IMPEDANCE WITH AMPLIFIER

Figure 1:
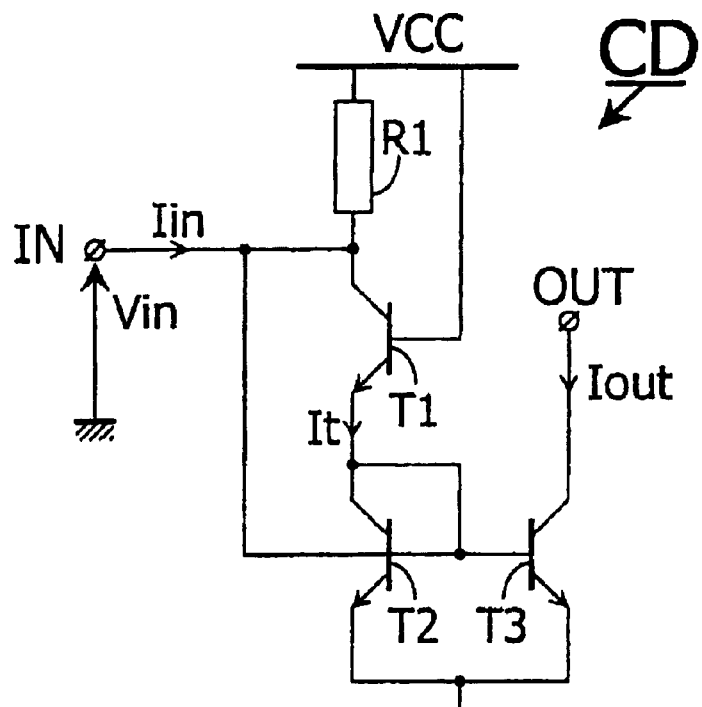

The present invention forms part of the field of amplifiers, notably current amplifiers. Such amplifiers are advantageously utilized in switching matrices which are circuits or circuit assemblies having N signal inputs and P signal outputs and which have as a peculiarity that each of the P outputs may be connected to each of the N inputs on command.

In such a matrix current paths having considerable lengths are to be used for connecting the inputs to the outputs, said lengths being all the larger as the number of inputs and outputs, and thus the complexity of the matrix under consideration, are larger. Generally, it will be chosen to utilize current signals rather than voltage signals for conveying data between the inputs and outputs of the matrix. In fact, the length of the current paths is such that it gives rise to resistance and capacitance losses which cause voltage drops which are not negligible relative to the amplitude of an AC component of a voltage signal which would transport a data.

As the switching matrices are currently realized in the form of integrated circuits, the current signals passing through them generally have a relatively low amplitude, more often of the order of a microampere. Such a current signal is thus to be amplified so as to be used by elements outside the matrix. However, as each output terminal is connected to a multiplicity of current paths which have considerable parasitic resistance and capacitance and form a substantial load seen from said output terminal, it is necessary for an amplifier intended to amplify the current signal before being made available on the output terminal to present a low input impedance so as to minimize signal losses.

Furthermore, for a signal available on an output terminal of the matrix to be effectively used by elements situated upstream of this matrix, it is desirable to construct the amplifier so that it shows a common-mode output level that is lowest possible, that is to say, that the value of the rest potential of its output terminal has to be the lowest possible. This will allow to save the widest possible variation range for an AC component of the output signal, which is representative of the information conveyed by said signal, by limiting the saturation risks of the input stages of the elements arranged downstream of the matrix.

It is an object of the invention to meet these requirements by proposing an amplifier which includes a first and a second transistor, each having a bias terminal, a transfer terminal and a reference terminal connected in series between a first and a second power supply terminal, the amplifier further including a first resistor inserted between the first power supply terminal and the transfer terminal of the first transistor, which transfer terminal is connected to the bias terminal of the second transistor and forms an input of the amplifier, the bias terminal of the first transistor being connected to a reference potential terminal.

It will be demonstrated in the following of the description that the amplifier according to the invention shows little input impedance, particularly because of the connection established between the transfer and bias terminals of the first and second transistors, respectively.

Various solutions may be envisaged for tapping an output signal from an amplifier in accordance with the invention.

In a first configuration the amplifier described above further includes a third transistor arranged as a current mirror with the second transistor, the transfer terminal of the third transistor forming an output of the amplifier.

Such a configuration permits to adjust the gain of the amplifier by the choice of a ratio of dimensions between the second and third transistors.

In a second configuration the amplifier described above further includes a third transistor arranged as a follower, whose transfer terminal forms an output of the amplifier and whose bias terminal is connected to the transfer terminal of the second transistor.

Such a configuration permits to adjust the gain of the amplifier by the choice of bias parameters of the follower incorporating the third transistor.

The following of the description will make it understood that in each of the configurations described above no current path separating the output of a ground of the amplifier includes more than one transistor, which guarantees a low common-mode level at the output of the amplifier.

An amplifier in accordance with the second configuration will advantageously include a second resistor inserted between the first and second transistors.

This second resistor generates a voltage drop which permits a larger signal excursion than the follower will receive on its input and thus permits a larger variation range of the output signal than the follower is intended to deliver.

In the description above, the amplifier shows an asymmetrical structure, that is to say, that its input and its output are intended to receive and deliver asymmetrical signals. In a number of applications it is preferable to use differential signals and symmetrical structures, notably with the aim to eliminate noise sources and noise vectors by means of compensating parasitic harmonics which are generated by components which are symmetrical on either one of the two sides of the structures involved.

The invention thus also proposes an amplifier which includes a first, a second, a third and a fourth transistor, each having a bias terminal, a transfer terminal and a reference terminal, the first and third transistors on the one hand, and the second and fourth transistors on the other hand, being connected in series between a first and a second power supply terminal, the amplifier further including a first and a second resistor, respectively, inserted between the first power supply terminal and the transfer terminals of the first and second transistors, which transfer terminals are connected to the bias terminals of the third and fourth transistors, respectively, and form a differential input of the amplifier, the bias terminals of the first and second transistors being connected together to a reference potential terminal, the third and fourth transistors together forming a differential pair.

Such an amplifier is not very noisy because of its symmetrical structure and shows an input impedance that is of the same order as that of the asymmetrical type of amplifier described above.

In a first configuration the symmetrical amplifier described above further includes a fifth and a sixth transistor arranged as current mirrors with the third and the fourth transistor, respectively, the transfer terminals of the fifth and sixth transistors forming a differential output of the amplifier.

Such a configuration permits to adjust the gain of the amplifier by the choice of a dimension ratio between the third and fifth transistors, on the one hand, and the fourth and sixth transistors on the other hand.

In a second configuration the symmetrical amplifier described above further includes a fifth and a sixth transistor which together form a differential output pair, whose transfer terminals form a differential output of the amplifier and whose power supply terminals are connected to the transfer terminals of the third and fourth transistors.

Such a configuration permits to adjust the gain of the amplifier by choosing bias parameters of the differential output pair.

The following of the description will make it understood that in each of the configurations described above no current path separating the differential output from ground of the amplifier includes a transistor anymore, which guarantees a low common-mode level at the output of the amplifier.

A symmetrical amplifier in accordance with the second configuration will advantageously include third and fourth resistors, inserted between the first and third transistors, respectively, on the one hand and the second and fourth transistors on the other.

These third and fourth resistors generate voltage drops which permit a larger excursion of the differential signal than the differential output pair will receive on its inputs, and thus authorizes a larger variation range of the output signal than said differential pair is intended to deliver.

Furthermore, it will be possible to provide the insertion of an additional resistor between the transfer terminals of the first and second transistors.

This additional resistor permits to deflect part of the current that would have passed through the first and second transistors in its absence, which current may be large if the dimensions of the third and fourth transistors are large. This permits to choose smaller dimensions for the first and second transistors without running the risk of seeing them damaged by strong currents.

As described previously, an amplifier according to the invention is particularly well adapted to being used in a switching matrix. The invention thus also relates to a switching matrix showing N signal inputs and P signal outputs, in which matrix each of the signal outputs may be connected to each of the signal inputs via at least one current path that includes at least an amplifier as described above.

These and other aspects of the invention are apparent from and will be elucidated, by way of non-limitative example, with reference to the embodiment(s) described hereinafter.

Figure 2:
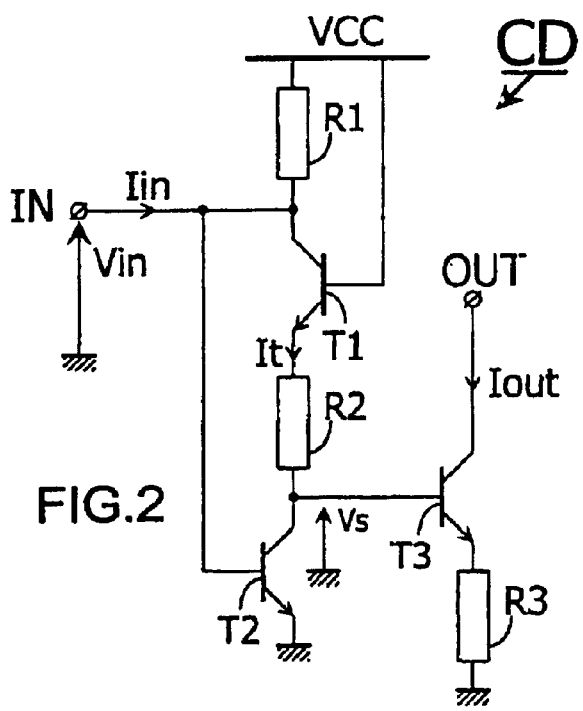
Figure 3:
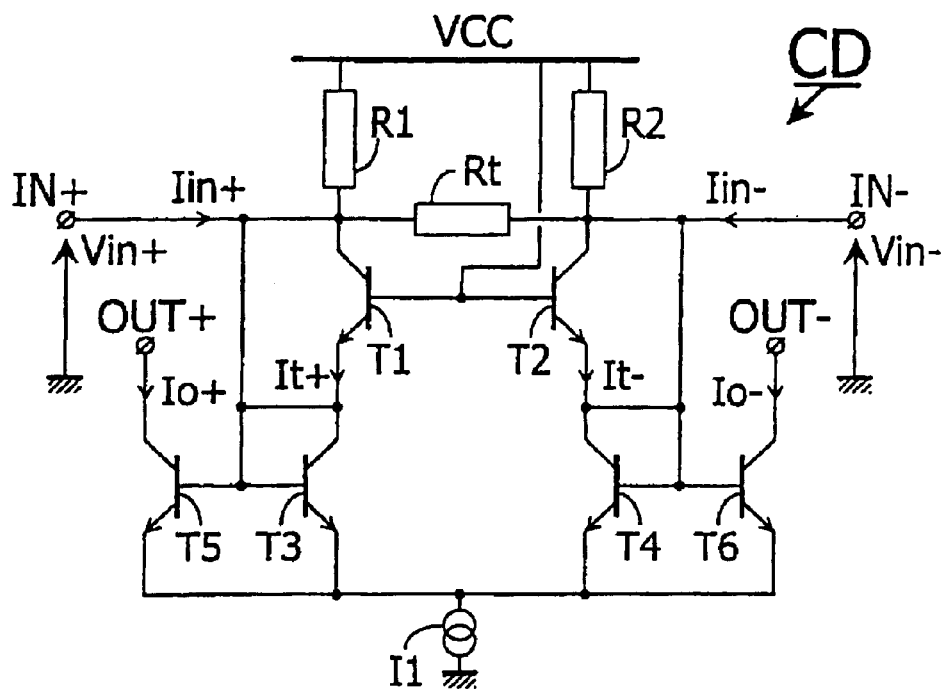
Figure 4:
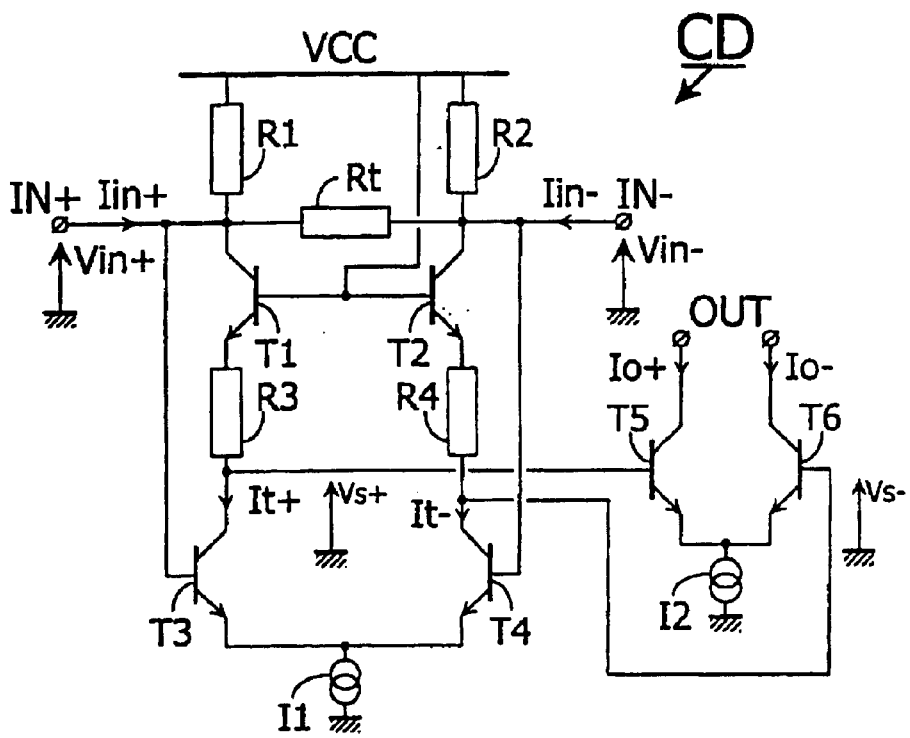
Figure 5:
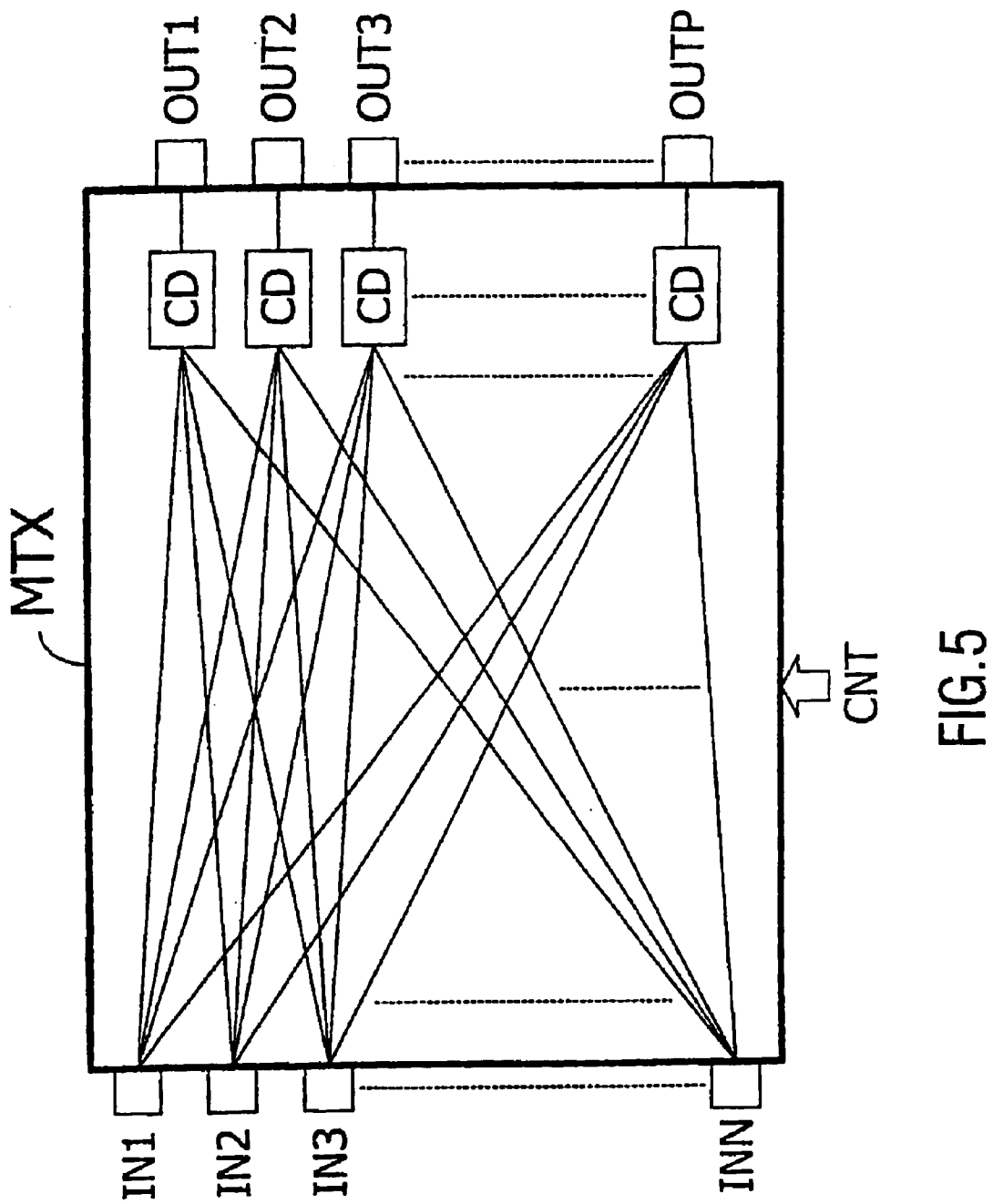

In the drawings:

FIG. 1 is an electrical diagram describing a first configuration of an asymmetrical amplifier according to the invention, FIG. 2 is an electrical diagram describing a second configuration of an asymmetrical amplifier according to the invention, FIG. 3 is an electrical diagram describing a first configuration of a symmetrical amplifier according to the invention, FIG. 4 is an electrical diagram describing a second configuration of a symmetrical amplifier according to the invention, and FIG. 5 is a partial functional diagram describing a switching matrix that incorporates an amplifier according to the invention.

FIG. 1 represents an amplifier CD according to the invention. This amplifier CD includes a first and a second transistor T1 and T2. These transistors are here bipolar-type transistors and have a base, a collector and an emitter which form a bias terminal, a transfer terminal and a reference terminal, respectively. The main current paths of the first and second transistors T1 and T2, formed by their collector-emitter junctions, are connected in series between a first and a second power supply terminal here in the form of an energy source VCC and ground of the amplifier CD. The amplifier CD represented here further includes a first resistor R1 inserted between the first power supply terminal VCC and the transfer terminal of the first transistor T1, which transfer terminal is connected to the bias terminal of the second transistor T2 and forms an input of the amplifier CD, which is intended to receive an input voltage Vin and an input current Iin. The bias terminal of the first transistor T1 is connected to a reference potential terminal in this case the first power supply terminal VCC.

It may easily be demonstrated by recurring to two equivalent circuit diagrams via small AC signals of the first and second transistors T1 and T2, that the amplifier CD shows an input impedance Zin=Vin/Iin which is in a first approximation equal to $R1/(1+gm0.R1)$, where gm0 is the transconductance of the transistors T1 and T2 equal to It/Vt with Vt/It=26 mA/V at 27° in current manufacturing technology.

Thus, when $R1.gm\phi$ is large compared to 1, which is the case once the order of magnitude of the first resistor R1 exceeds 1 Ohm, the value of the input impedance Zin of the amplifier CD is close to 1/gm0=26 mΩ.

FIG. 1 represents a first configuration of an amplifier CD in accordance with the invention intended to produce an output current Iout tapped by means of a third transistor T3 arranged as a current mirror with the second transistor T2, the transfer terminal of the third transistor forming an output OUT of the amplifier CD.

Such a configuration permits to adjust the gain of the amplifier CD by choosing a dimension ratio between the second and third transistors T2 and T3. Thus if the third transistor T3 is k times larger than the second transistor T2, one will have Iout=k.It where It is a current intended to pass through the second transistor T2.

FIG. 2 represents a second configuration of an amplifier CD according to the invention, intended to produce an output current Iout tapped by means of the third transistor T3 arranged as a follower, whose transfer terminal forms an output OUT of the amplifier CD and whose bias terminal is connected to the transfer terminal of the second transistor T2. A second resistor R2 is inserted between the first and second transistors T1 and T2. This second resistor R2 generates a voltage drop R2.It which permits a larger excursion of the signal Vs=VCC−(R1+R2).It which will be received by the server on its input, and thus authorizes a larger variation range of the output signal Iout than the follower is intended to deliver. Such a configuration permits to adjust the gain of the amplifier CD by a choice of bias parameters of the follower incorporating the third transistor T3, for example, by regulating the value of a third resistor R3 intended to bias said follower.

It should be noted that none of the configurations described with reference to FIGS. 1 and 2, no current path separating the output OUT from the ground of the amplifier CD includes more than one transistor, which guarantees a low common-mode level on the output of the amplifier CD.

FIG. 3 represents a symmetrical amplifier CD in accordance with the invention. This amplifier CD includes a first, a second, a third and a fourth transistor T1, T2, T3 and T4. These transistors are bipolar transistors here and thus have a base, collector and emitter which form a bias terminal, transfer terminal and reference terminal, respectively. The main current paths of the first and third transistors T1 and T3, on the one hand, and the second and fourth transistors T2 and T4, on the other, formed by their collector-emitter junctions are connected in series between a first and a second power supply terminal here in the form of an energy source VCC and ground of the amplifier CD. This amplifier CD further includes a first and a second resistor R1 and R2 inserted between the first power supply terminal VCC and the transfer terminals of the first and second transistor T1 and T2, respectively, which transfer terminals are connected to the bias terminals of the third and fourth transistors T3 and T4, respectively, and form a differential input (IN+,IN−) of the symmetrical amplifier CD, the bias terminals of the first and second transistors T1 and T2 being together connected to a reference potential terminal here in the form of the first power supply terminal VCC, the third and fourth transistors T3 and T4 together forming a differential pair, biased here by a first current source I1.

This amplifier CD thus shows a symmetrical structure which is to say that it has a differential input (IN+, IN−) and a differential output (OUT+, OUT−) intended to receive and deliver symmetrical signals (Iin+, Iin−) and (Io+, Io−), respectively. Such a structure permits inter alia to eliminate noise sources and noise vectors by means of parasitic harmonic compensation means generated by components that are symmetrical on either one of the two sides of the structure, according to a technique well known to a man of ordinary skill in the art. The input impedance Zin of such an amplifier, which employs two asymmetrical structures such as described above, which appear connected in series between the two input terminals IN+ and IN−, and input signals (Vin+, Vin−) and (Iin+, Iin−) having twice the amplitude of those presented in the description of the asymmetrical structures is of the same order as that of said asymmetrical structures.

FIG. 3 represents a first configuration of a symmetrical amplifier CD in accordance with the invention, intended to produce a differential output current (Io+, Io−) tapped by a fifth and sixth transistor T5 and T6 arranged as current mirrors with the third and fourth transistors T3 and T4, respectively, the transfer terminals of the fifth and sixth transistors forming a differential output OUT of the amplifier CD. Such a configuration permits to adjust the gain of the amplifier CD by the choice of a dimension ratio between the third and fifth transistors T3 and T5, on the one hand, and the fourth and sixth transistors T4 and T6, on the other.

FIG. 4 shows a second configuration of a symmetrical amplifier CD according to the invention, intended to produce a differential output current (Io+, Io−) tapped by means of a fifth and a sixth transistor T5 and T6, which together form a differential output pair, whose transfer terminals form a differential output OUT of the amplifier CD and whose bias terminals are connected to the transfer terminals of the third and fourth transistors T3 and T4. Such a configuration permits to adjust the gain of the amplifier CD by the choice of the bias parameters of the differential output pair (T5, T6), for example, by the adjustment of a current supplied by a second current source I2 intended to bias said differential pair.

Third and fourth resistors R3 and R4 are inserted between the first and third transistors T1 and T3, on the one hand, and the second and fourth transistors T2 and T4 on the other, respectively. These third and fourth resistors R3 and R4 generate voltage drops R3.It+ and R4.It−, respectively, which permit a larger excursion of the differential signal (Vs+, Vs−) than the differential output pair (T5, T6) will receive on its inputs, and thus permit a larger variation range of the output signal (Io+, Io−) than said differential pair is intended to deliver.

Furthermore, there may be provided to insert an additional resistor Rt between the transfer terminals of the first and second transistors T1 and T2.

This resistor Rt permits to deflect part of the current (It+, It−) that would have run through the first and second transistors T1 and T2 in its absence, which current may be important if the dimensions of the third and fourth transistors T3 and T4 are large. This permits to choose smaller dimensions for the first and second transistors T1 and T2 without running the risk of seeing them damaged by strong currents.

It should be observed that in each of the configurations described by the FIGS. 3 and 4 no current path separating the output OUT from the ground of the symmetrical amplifier CD includes more than one transistor, which guarantees a low common-mode level on the output of the amplifier CD.

Furthermore, if the transistors used in the examples described above are all of the bipolar type, it is perfectly feasible to substitute all of them or partly by transistors of the MOS type which have a gate, drain and source which respectively form a bias terminal, transfer terminal and reference terminal of the transistors involved.

FIG. 5 represents in a diagram a switching matrix MTX which has N signal inputs (IN1 . . . INN) and p signal outputs (OUT1 . . . OUTP), in which matrix each of the signal outputs OUTi (for i=1 to P) may be connected to each of the signal inputs (IN1 . . . INN) via at least one current path that includes at least an amplifier CD as described above. A selection of the current paths which in effect connect the inputs to the outputs of the matrix in a given configuration is realized by the choice of a value of a control signal CNT.

The amplifier CD according to the invention amplifies a current signal coming from any one of the signal inputs INi (for i=1 to N) before it is rendered available on an output terminal OUTi (for i=1 to P). As each output terminal OUTi (for i=1 to P) is connected to a multiplicity of current paths creating a large load, the low input impedance of the amplifier CD in accordance with the invention permits a good recovery of the information collected on the input terminal INi to which it is connected. Furthermore, the low common-mode level of the output signal of the amplifier CD permits to provide the largest variation range possible for an AC component of the signal present on the output terminal OUTi (for i=1 to P) while limiting the saturation risks of input stages of elements arranged downstream of the matrix MTX.

What is claimed is:

1. An amplifier including a first and a second transistor, each having a bias terminal, a transfer terminal and a reference terminal connected in series between a first and a second power supply terminal, the amplifier further including a first resistor inserted between the first power supply terminal and the transfer terminal of the first transistor, which transfer terminal is connected to the bias terminal of the second transistor and forms an input of the amplifier, the bias terminal of the first transistor being connected to a reference potential terminal wherein the amplifier includes a third transistor arranged as a current mirror with the second transistor, the transfer terminal of the third transistor forming an output of the amplifier.

2. An amplifier including a first and a second transistor, each having a bias terminal, a transfer terminal and a reference terminal connected in series between a first and a second power supply terminal, the amplifier further including a first resistor inserted between the first power supply terminal and the transfer terminal of the first transistor, which transfer terminal is connected to the bias terminal of the second transistor and forms an input of the amplifier, the bias terminal of the first transistor being connected to a reference potential terminal wherein the amplifier includes a third transistor arranged as a follower whose transfer terminal forms an output of the amplifier and whose bias terminal is connected to the transfer terminal of the second transistor.

3. An amplifier as claimed in claim 2, including a second resistor inserted between the first and the second transistor.

4. An amplifier including a first, a second, a third and a fourth transistor each having a bias terminal, a transfer terminal and a reference terminal, the first and third transistors, on the one hand, and the second and fourth transistors, on the other, being connected in series between a first and a second power supply terminal, the amplifier further including a first and a second resistor inserted between the first power supply terminal and the transfer terminals of the first and second transistors, respectively, which transfer terminals are connected to the bias terminals of the third and fourth transistors, respectively, and form a differential input of the amplifier, the bias terminals of the first and second transistors being connected together to a reference potential terminal, the third and fourth transistors together forming a differential pair.

5. An amplifier as claimed in claim 4, including fifth and sixth transistors arranged as current mirrors with the third and fourth transistors, respectively, the transfer terminals of the fifth and sixth transistors forming a differential output of the amplifier.

6. An amplifier as claimed in claim 4, including fifth and sixth transistors which together form a differential pair whose transfer terminals form a differential output of the amplifier and whose bias terminals are connected to the transfer terminals of the third and fourth transistors.

7. An amplifier as claimed in claim 6, including third and fourth resistors inserted between the first and third transistors, respectively, on the one hand, and the second and fourth transistors, on the other.

8. An amplifier as claimed in claim 4, further including a resistor inserted between the transfer terminals of the first and second transistors.

9. A switching matrix having N signal inputs and P signal outputs, in which each of the signal outputs may be connected to each of the signal inputs via at least a current path that includes at least an amplifier as claimed in claim 1.

* * * * *